United States Patent
Gratz et al.

(10) Patent No.: US 8,994,148 B2
(45) Date of Patent: Mar. 31, 2015

(54) DEVICE BOND PADS OVER PROCESS CONTROL MONITOR STRUCTURES IN A SEMICONDUCTOR DIE

(71) Applicant: Infineon Technologies AG, Neubiberg (DE)

(72) Inventors: Achim Gratz, Dresden (DE); Scott David Wallace, Moritzburg (DE); Tobias Jacobs, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/770,639

(22) Filed: Feb. 19, 2013

(65) Prior Publication Data
US 2014/0232001 A1 Aug. 21, 2014

(51) Int. Cl.
*H01L 23/544* (2006.01)
*H01L 21/768* (2006.01)
*H01L 23/522* (2006.01)
*H01L 23/532* (2006.01)
*H01L 23/00* (2006.01)

(52) U.S. Cl.
CPC .......... *H01L 21/768* (2013.01); *H01L 23/5226* (2013.01); *H01L 23/53228* (2013.01); *H01L 24/00* (2013.01)
USPC ........................................................ 257/620

(58) Field of Classification Search
CPC ......... H01L 22/32; H01L 22/34; H01L 24/05; H01L 24/06
USPC ............ 257/E21.524, E23.178, 48, 773, 774, 257/776, 620, E21.521
See application file for complete search history.

(56) References Cited

U.S. PATENT DOCUMENTS

| 7,482,675 B2 * | 1/2009 | Adkisson et al. ............. 257/620 |
| 2009/0236637 A1 * | 9/2009 | Ko et al. ........................ 257/207 |
| 2013/0023091 A1 * | 1/2013 | Leal et al. ..................... 438/132 |

* cited by examiner

*Primary Examiner* — Armando Rodriguez
*Assistant Examiner* — Mohammed R Alam
(74) *Attorney, Agent, or Firm* — Murphy, Bilak & Homiller, PLLC (57) ABSTRACT

A semiconductor die includes a semiconductor substrate having an edge region surrounding an active region, the active region containing devices of an integrated circuit. The semiconductor die further includes interconnect wiring over the active region in an interlayer dielectric and electrically connected to the devices in the active region, and ancillary wiring over the edge region in the interlayer dielectric and isolated from the interconnect wiring and the devices in the active device region. The interlayer dielectric is passivated, and bond pads are provided over the interconnect wiring and electrically connected to the interconnect wiring through openings in the passivation over the active region. Additional bond pads are provided over the ancillary wiring and are electrically connected to the interconnect wiring through additional openings in the passivation over the active region.

12 Claims, 11 Drawing Sheets

DEVICE BOND PADS OVER PROCESS CONTROL MONITOR STRUCTURES IN A SEMICONDUCTOR DIE

TECHNICAL FIELD

The instant application relates to semiconductor dies and, more particularly, to providing additional bond pads over process control monitor structures remaining in a semiconductor die.

BACKGROUND

Process control monitoring (PCM) is a technique widely employed in the semiconductor industry to obtain detailed information about the process used to fabricate integrated circuit dies on a semiconductor wafer. PCM typically involves designing and fabricating special structures that can monitor technology specific electrical parameters such as threshold voltage and gate oxide thickness in CMOS technologies and base-emitter junction voltage and gain in bipolar technologies, to name a few. PCM is also used to monitor various interconnect parameters such as sheet resistance, contact resistance, delta line width, etc. PCM structures are placed across a semiconductor wafer at specific locations to gain a better understanding of the process variation. PCM structures are typically placed in the scribe line (also known as kerf, street or test key) separating adjacent dies on the wafer. Some mechanical sawing processes used to separate individual dies from a wafer do not permit any metal structures in the scribe line. For such mechanical sawing processes, the area used for PCM structures is wasted since this area cannot coincide with the sawing scribe lines. PCM structures are typically provided as either so-called drop-in-chips or placed into extra (no-sawing) scribe lines. In both cases valuable area is wasted.

SUMMARY

According to the embodiments described herein, a metal re-distribution layer is provided on top of the interconnect passivation of a semiconductor die to provide a bond pad metal outside the active region of the die, and which overlaps at least some of the PCM (process control monitoring) or other structures disposed in an edge region of the die. These structures do not form part of the integrated circuit fabricated on the die, and, therefore, typically have no meaningful use post manufacture. The area otherwise wasted by these structures post-manufacture becomes usable again in this manner. This is particularly beneficial for pad-limited designs in that a previously unused edge area of a die is now utilized for additional bond pads which can be electrically connected to the integrated circuit fabricated on the die.

According to an embodiment of a semiconductor die, the semiconductor die comprises a semiconductor substrate having an edge region surrounding an active region, the active region containing devices of an integrated circuit, and interconnect wiring over the active region in an interlayer dielectric and electrically connected to the devices in the active region. The semiconductor die further comprises ancillary wiring over the edge region in the interlayer dielectric, which is isolated from the interconnect wiring and the devices in the active device region. A passivation is provided on the interlayer dielectric. A plurality of bond pads are provided over the interconnect wiring and are electrically connected to the interconnect wiring through openings in the passivation over the active region. A plurality of additional bond pads are provided over the ancillary wiring and are electrically connected to the interconnect wiring through additional openings in the passivation over the active region.

According to an embodiment of a method of manufacturing a semiconductor die, the method comprises: forming a semiconductor substrate having an edge region surrounding an active region, the active region containing devices of an integrated circuit; forming interconnect wiring over the active region in an interlayer dielectric and in electrical connection with the devices in the active region; forming ancillary wiring over the edge region in the interlayer dielectric and in isolation from the interconnect wiring and the devices in the active device region; forming a passivation on the interlayer dielectric; forming a plurality of bond pads over the interconnect wiring and in electrical connection to the interconnect wiring through openings in the passivation over the active region; and forming a plurality of additional bond pads over the ancillary wiring and in electrical connection to the interconnect wiring through additional openings in the passivation over the active region.

According to an embodiment of a method of processing a semiconductor wafer, the method comprises: forming a plurality of semiconductor dies in the semiconductor wafer, each semiconductor die having an active region containing devices of an integrated circuit and an edge region surrounding the active region, adjacent ones of the semiconductor dies being separated by a scribe line; forming interconnect wiring over the active region of each semiconductor die in an interlayer dielectric; forming ancillary wiring over the edge region of each semiconductor die in the interlayer dielectric; forming a passivation on the interlayer dielectric; forming a plurality of bond pads over the interconnect wiring of each semiconductor die, the bond pads of each semiconductor die being in electrical connection with the interconnect wiring of that semiconductor die; and forming a plurality of additional bond pads over the ancillary wiring of each semiconductor die, the additional bond pads of each semiconductor die being in electrical connection with the interconnect wiring of that semiconductor die.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

The embodiments described next utilize the area allocated for PCM or other structures in the scribe line or edge region of a semiconductor die, particularly for providing additional bond pad connections to an integrated circuit fabricated in an active region of the die. As used herein the terms 'scribe line structure' and 'ancillary wiring' are intended to include structures in the scribe line or edge region of a semiconductor die which do not form part of the integrated circuit for which the die was designed, such as process monitor control structures, lithography alignment and overlay marks, film thickness and critical dimension metrology structures, etc. Such an approach is especially advantageous for pad-limited designs such as processors, memories, etc. A metal redistribution layer is provided on top of the interconnect passivation to provide a bond pad metal outside of the active region of the semiconductor die. The redistribution layer overlaps at least some of the scribe line structures in the edge region of the die. A final PCM measurement can be done when the last metal layer of the die interconnect wiring is completed. After passivation of the last metal layer, the bond pad metal is deposited as a redistribution layer which overlaps the active region of the die and at least some of the PCM structures in the edge region of the die, which is devoid of any integrated circuit devices or wiring. The area otherwise unused after PCM becomes usable again in this manner.

Figure 1:
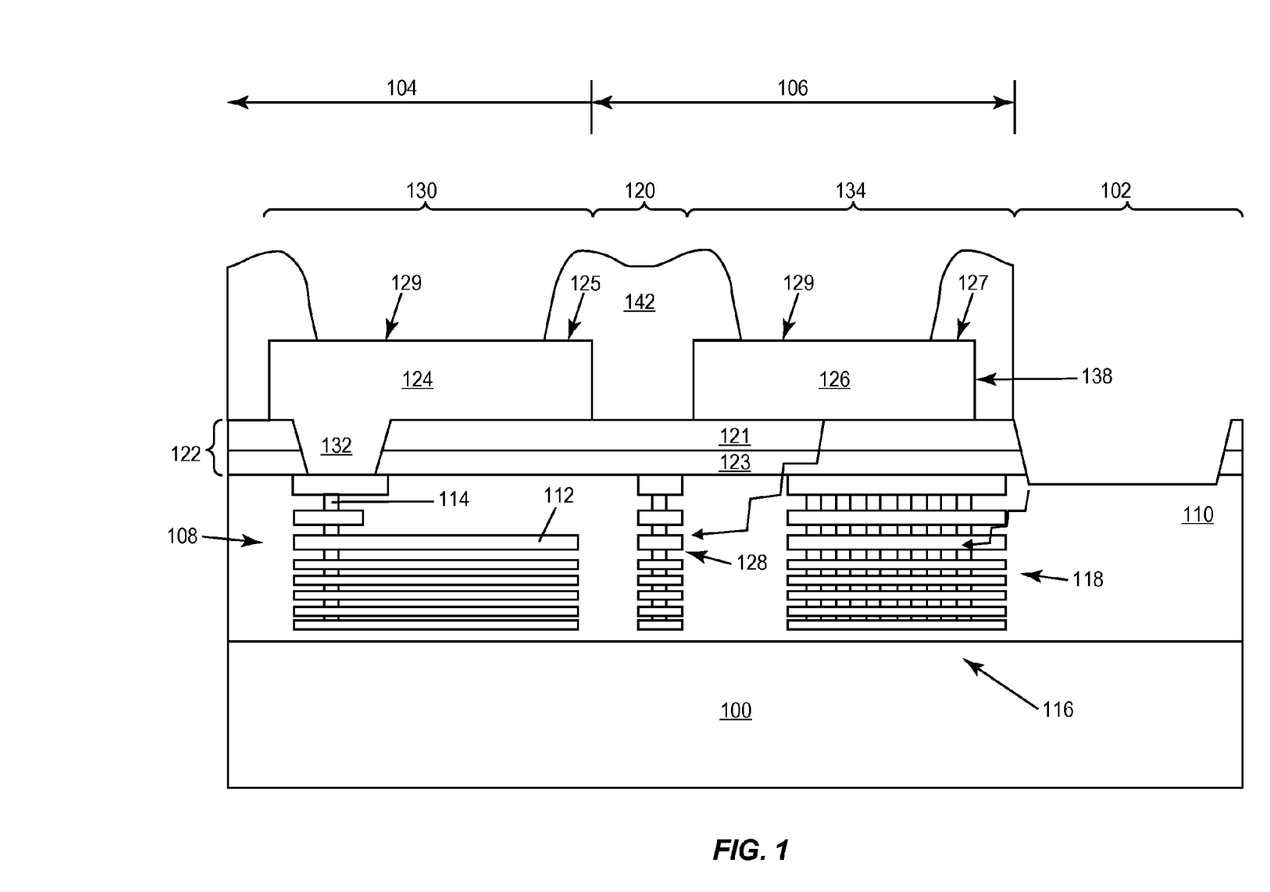
FIG. 1 illustrates a cross-sectional view of an embodiment of a semiconductor die having bond pads over an active region of the die and additional bond pads over an edge region of the die which surrounds the active region.
Figure 2:
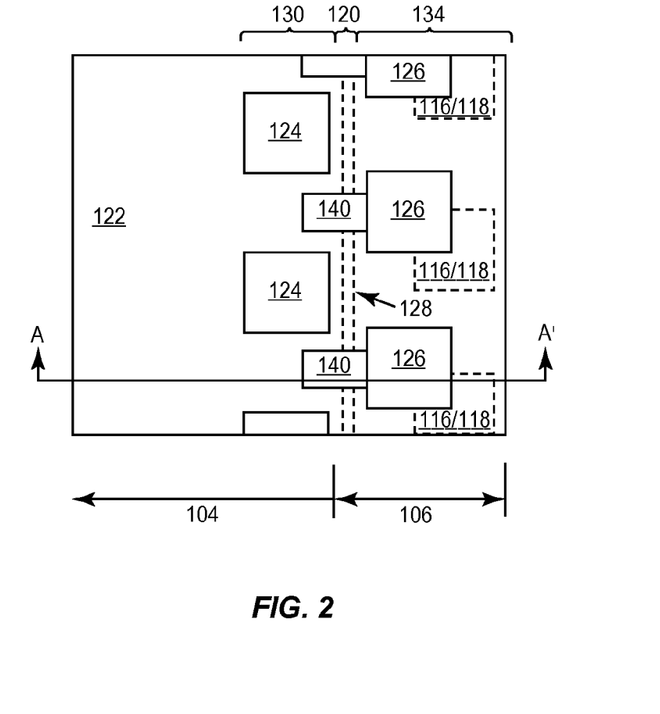
FIG. 2 illustrates a top-down plan view of the semiconductor die of FIG. 1.
Figure 3:
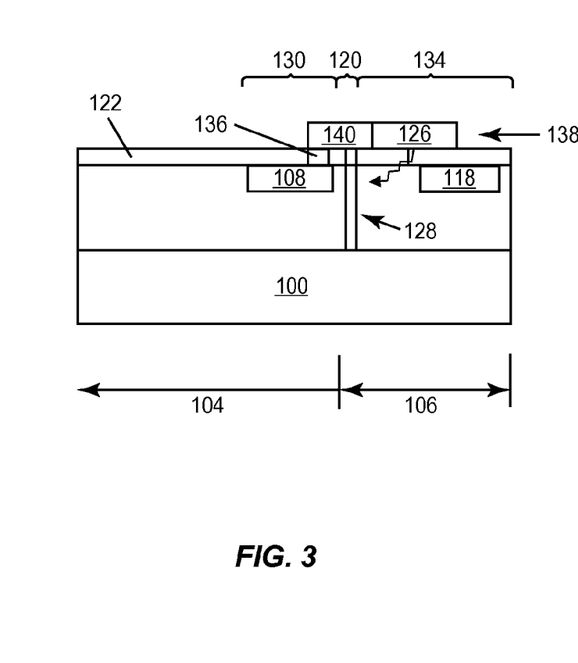
FIG. 3 illustrates another cross-sectional view of the semiconductor die along the line labeled A-A' in FIG. 1.

FIG. 1 illustrates a partial cross-sectional view of an embodiment of a semiconductor die prior to separation from a semiconductor wafer 100. FIG. 2 illustrates a partial top-down plan view of the semiconductor die post-sawing (i.e. after individual ones of the dies are separated from each other), and FIG. 3 shows a cross-sectional view of the die along the line labeled A-A' in FIG. 2. The part of the semiconductor wafer 100 that remains after sawing of the semiconductor wafer 100 into individual dies (also commonly referred to as cutting or dicing) forms a semiconductor substrate 100 for each individual die. The dies are separated from one another by sawing along a scribe line 102. The die has an active region 104 and an edge region 106. Devices of an integrated circuit are formed in the semiconductor substrate 100 in the active region 104 of the die. Interconnect wiring 108 for the integrated circuit devices is disposed in an interlayer dielectric 110 on the substrate 100 in the active region 104 of the die. The interconnect wiring 108 can comprise multiple layers 112 of wiring vertically interconnected by electrically conductive vias 114. One or more of the wiring layers 112 can comprise copper, and the other wiring layers 112 can comprise aluminum. Alternatively, all of the wiring layers 112 can comprise either copper or aluminum. In each case, PCM (or other) structures 116 are formed in the edge region 106 of the die. The PCM (or other) structures 116 can include ancillary wiring (interconnect) 118 fabricated by using the same metallurgy processing as the integrated circuit interconnect wiring 108, and which is formed in the interlayer dielectric 110 in the edge region 106. The PCM structures 116 can also include process monitoring devices fabricated in the underlying semiconductor wafer 100 in the edge region 106. No integrated circuit or PCM devices are shown in FIG. 1, for ease of illustration. In general, the PCM structures 116 in the edge region 106 of the die are isolated from the interconnect wiring 108 and integrated circuit devices in the active region 104 of the die, e.g. by at least the interlayer dielectric 110.

The edge region 106 of the die, which contains the PCM structures 116 and is devoid of any integrated circuit devices or interconnect wiring, also has a seal ring 120. The seal ring 120 prevents cracks from propagating inward from the edge region 106 to the active region 104 of the die, and can also form a moisture barrier. Exemplary cracks are represented in FIG. 1 by jagged lines. Cracks can propagate in the interlayer dielectric 110 from the scribe line 102 toward the active region 104 as a result of the wafer sawing process. Cracks can also propagate through the interconnect passivation 122 and into the underlying interlayer dielectric 110 as a result of bonding and probing of the bond pads 124, 126 formed on the interconnect passivation 122. Further crack propagation can happen during encapsulation of the die in a package and due to thermo-mechanical stress during operation of the packaged semiconductor device. The seal ring 120 can include a crack stop structure 128 in the interlayer dielectric 110 which surrounds the active region 104 of the die to prevent any cracks from propagating into the active region 104 or the interconnect wiring 108 therein. Various constructions of crack stop structures 128 are well known in the semiconductor arts, and therefore no further explanation is provided herein in this regard. According to the embodiment illustrated in FIG. 1, the crack stop structure 128 of the seal ring 120 is interposed between the interconnect wiring 108 and the ancillary wiring 118 in the interlayer dielectric 110.

Bond pads 124, 126 for electrically connecting to the interconnect wiring 108 of the integrated circuit are formed on the interconnect passivation 122. Any suitable passivation can be used, such as silicon nitride 121 and/or silicon dioxide 123. The bond pads 124, 126 are relatively large metal areas on the die used for electrical contact with a package or probe pins. The bond pads 124, 126 can comprise copper or aluminum. Bond pad constructions based on other materials or multiple layers are also known. In each case, some of the bond pads 124 are disposed over the interconnect wiring 108 in a bond pad section 130 of the active region 104 of the die, and are electrically connected to the underlying interconnect wiring 108 by conductive vias 132 disposed in openings formed in the interconnect passivation 122 over the active region 104. The remaining bond pads 126 are disposed over the ancillary wiring 118 in an auxiliary bond pad section 134 of the edge region 106, and are electrically connected to the interconnect wiring 108 by conductive vias 136 disposed in additional openings in the interconnect passivation 122 over the active region 104. The bond pads 124, 126 are formed in a metal redistribution layer 138 on the interconnect passivation 122.

FIG. 2 shows a top-down plan view of some of the bonds pads 124, 126 for part of the die. The PCM structures 116 and any corresponding interconnect 118 are formed under the interconnect passivation 122, and are, therefore, shown as dashed regions in FIG. 2. The additional bond pads 126 in the edge region 106 partly cover some of the PCM structures 116, but do not cover any part of the crack stop structure 128 according to this embodiment. The crack stop structure 128 is also illustrated with dashed lines in FIG. 2, since it is out of view. Each additional bond pad 126 over the PCM structures 116 is electrically connected to the interconnect wiring 108 through a metal connector 140 extending from that additional bond pad 126 along the interconnect passivation 122 and terminating between adjacent ones of the bond pads 124 in the active region 104. An electrically conductive via 136 disposed in one of the additional openings in the interconnect passivation 122 over the active region 104 completes the electrical connection as shown in FIG. 3.

Returning to FIG. 1, a final passivation 142 can be provided over the active region 104 and edge region 106 of the semiconductor die. The final passivation 142 covers the interconnect passivation 122, edges 125 of the bond pads 124 over the interconnect wiring 108, and edges 127 of the additional bond pads 126 over the ancillary wiring 118. According to this embodiment, the bond pads 124 over the interconnect wiring 108 and the additional bond pads 126 over the ancillary wiring 118 each have a bonding surface 129 unobstructed by the final passivation 142. The final passivation 142 is omitted from FIGS. 2 and 3 for ease of illustration.

The sawing scribe line 102 is free of interfering (PCM) structures 116. Some mechanical sawing processes used to separate individual dies from a wafer do not permit any metal structures in the scribe line. For such mechanical sawing processes, additional area must be used for the PCM structures. This area is not wasted according to this embodiment, since additional bond pads 126 for electrically connecting to the interconnect wiring 108 of the integrated circuit are disposed outside the active region 104 of the die over the ancillary wiring 118. Also according to this embodiment, the die seal ring 120 is placed further from the sawing scribe line 102, providing a larger safety margin against sawing cracks encroaching on the active region 104 of the die.

Figure 4:
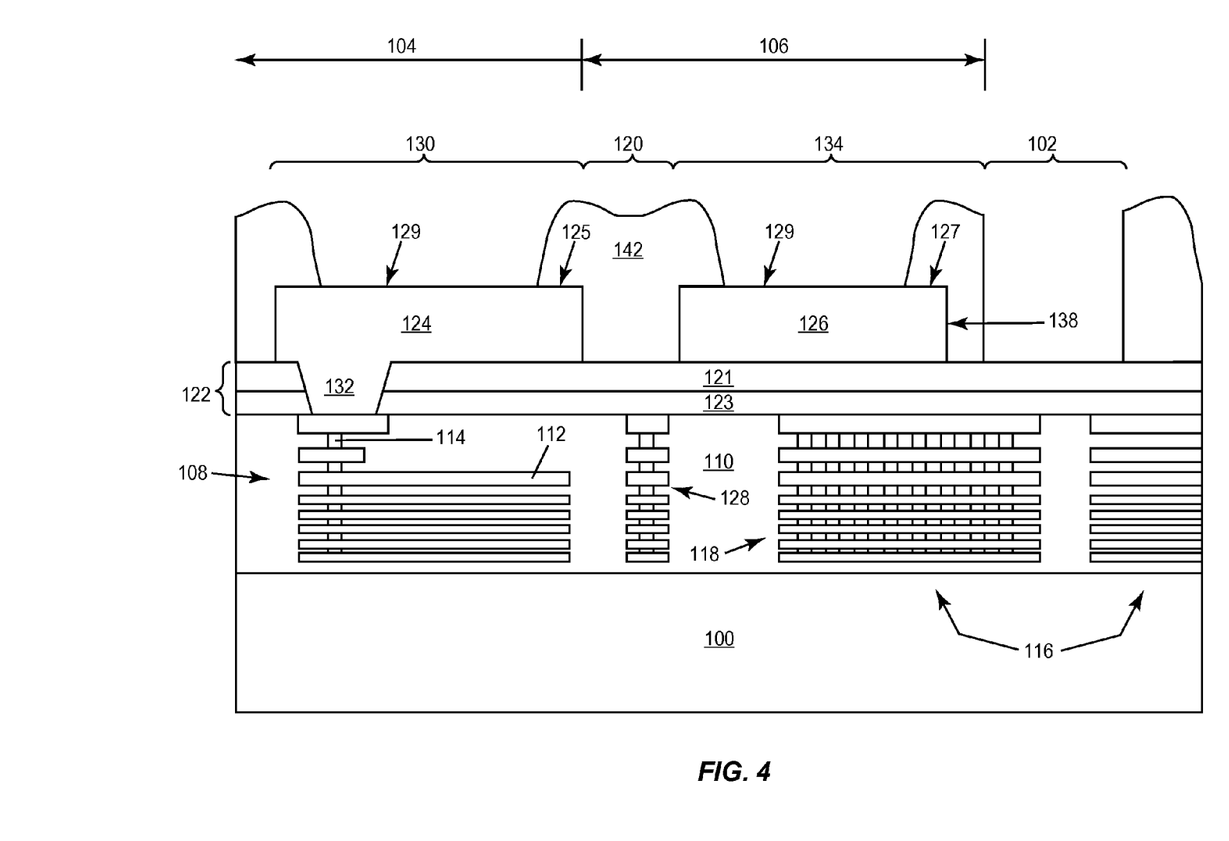
FIG. 4 illustrates a cross-sectional view of another embodiment of a semiconductor die having bond pads over an active region of the die and additional bond pads over an edge region of the die which surrounds the active region.

FIG. 4 illustrates another embodiment of a semiconductor die prior to separation from a semiconductor wafer 100. The embodiment shown in FIG. 4 is similar to the embodiment shown in FIG. 1, however, the ancillary wiring 118 included in the edge region 106 of adjacent dies at least partly protrude into the sawing scribe line 102 between the two dies. This embodiment is suited for mechanical sawing processes that can cut through metal structures in the scribe line 102.

Figure 5:
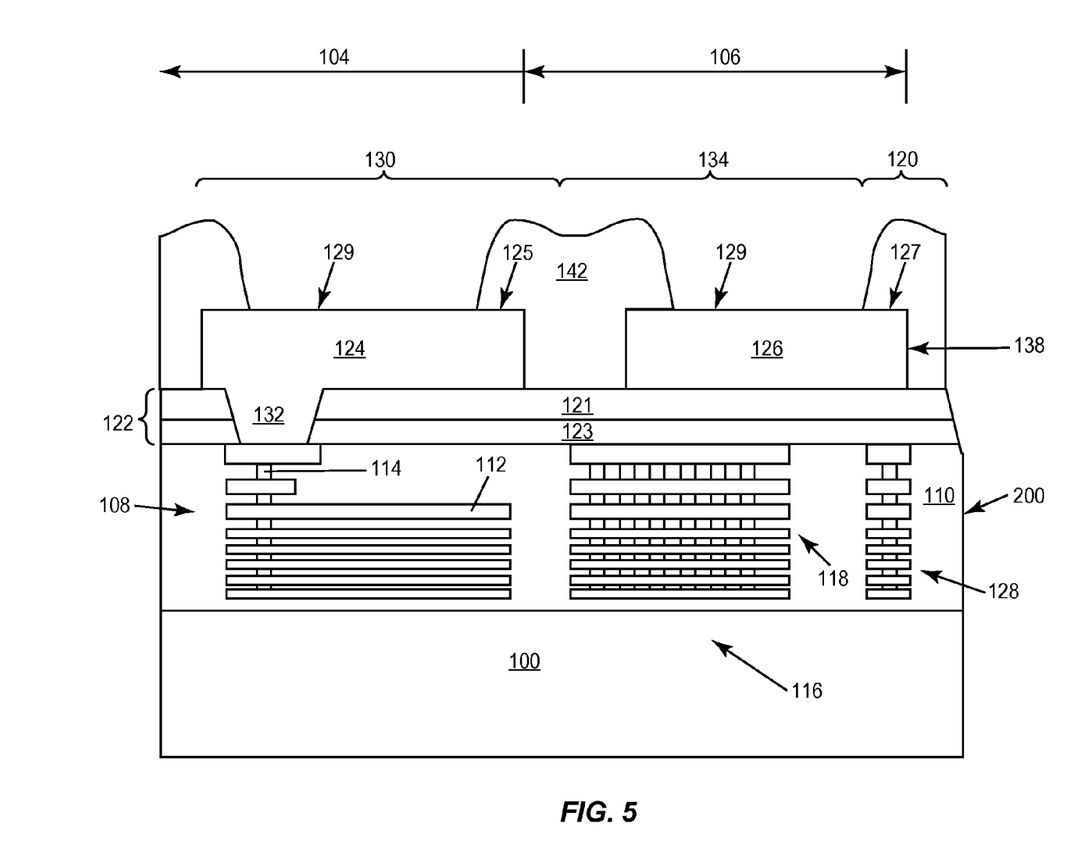
FIG. 5 illustrates a cross-sectional view of yet another embodiment of a semiconductor die having bond pads over an active region of the die and additional bond pads over an edge region of the die which surrounds the active region.
Figure 6:
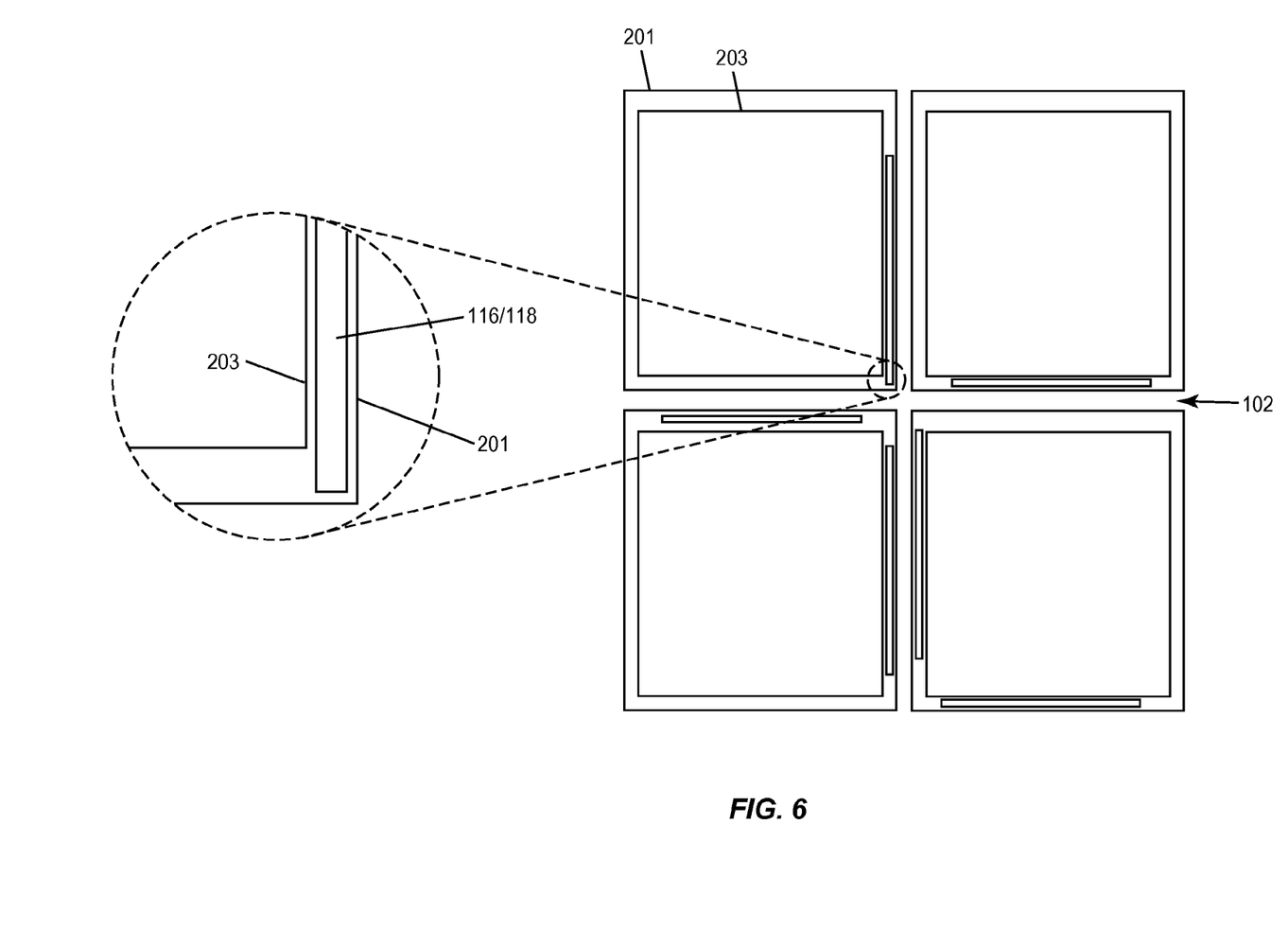
FIG. 6 illustrates a top-down plan view of a semiconductor wafer from which the die of FIG. 5 is manufactured.

FIG. 5 illustrates a cross-sectional view of yet another embodiment of a semiconductor die in post-separation from a semiconductor wafer 100, and FIG. 6 illustrates a top-down plan of the die in a reticle of four dies prior to separation from the semiconductor wafer 100. The embodiment shown in FIGS. 5 and 6 is similar to the embodiment shown in FIG. 1, however, the crack stop structure 128 of the seal ring 120 is disposed in the interlayer dielectric 110 between the ancillary wiring 118 and a lateral edge 200 of the semiconductor die. The expanded view shown in FIG. 6 shows that the ancillary wiring 118 terminates prior to reaching an outer boundary 201 of the seal ring 120. As such, the ancillary wiring 118 is bounded by the outer boundary 201 of the seal ring 120 and an outer boundary 203 of the active region 104 of the die. Also according to this embodiment, the interlayer dielectric 110 is devoid of any metal between the lateral edge 200 of the semiconductor die and the ancillary wiring 118 in the scribe line 102. In other embodiments a first (inner) crack stop structure can be interposed between the interconnect wiring 108 and the ancillary wiring 118 in the interlayer dielectric 110 as shown in FIGS. 1 and 3, and a second (outer) crack stop structure can be disposed in the interlayer dielectric 110 between the ancillary wiring 118 and the lateral edge 200 of the semiconductor die as shown in FIG. 5.

Figure 7:
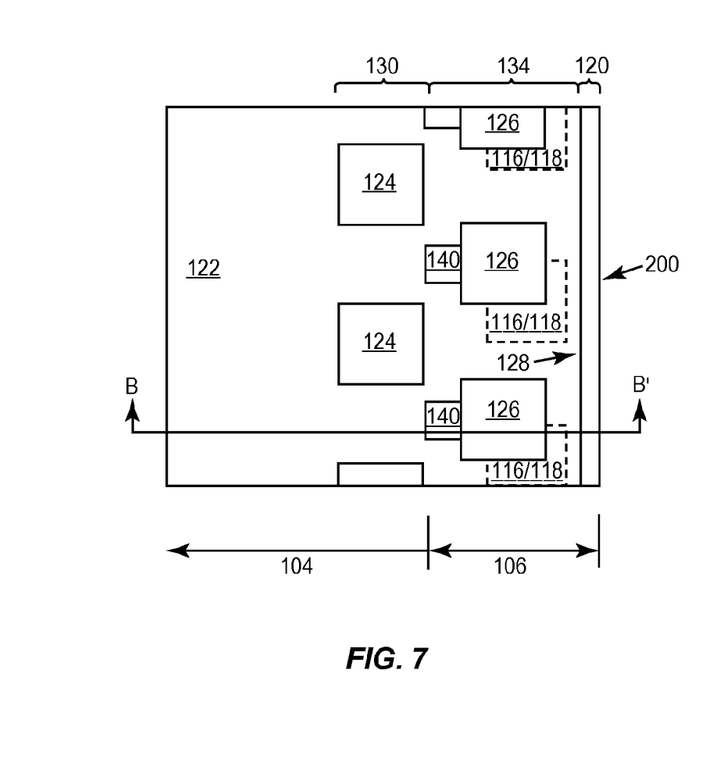
FIG. 7 illustrates a top-down plan view of the semiconductor die of FIG. 5.
Figure 8:
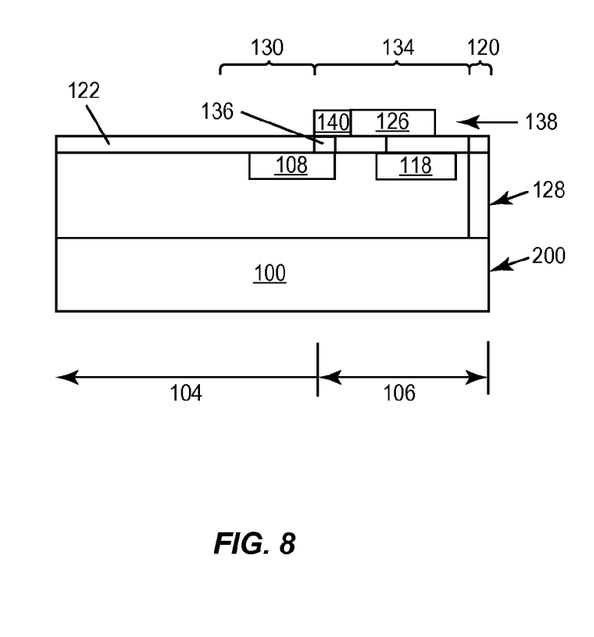
FIG. 8 illustrates another cross-sectional view of the semiconductor die along the line labeled B-B' in FIG. 7.

FIG. 7 illustrates a partial top-down plan view of the semiconductor die of FIG. 5, and FIG. 8 shows a cross-sectional view of the die along the line labeled B-B' in FIG. 7. The PCM structures 116 are formed under the interconnect passivation 122, and are therefore shown as dashed regions in FIG. 7. The additional bond pads 126 in the edge region 106 partly cover some of the PCM structures 116, but do not cover any part of the crack stop structure 128 according to this embodiment. Each additional bond pad 126 over the PCM structures 116 is electrically connected to the interconnect wiring 108 through a metal connector 140 extending from that additional bond pad 126 along the interconnect passivation 122 and terminating between adjacent ones of the bond pads 124 over the active region 104 of the die. Electrically conductive vias 136 disposed in the additional openings in the interconnect passivation 122 over the active region 104 complete the electrical connection to the interconnect wiring 108, as shown in FIG. 8. These vias 136 and corresponding metal connectors 140 on the interconnect passivation 122 are out of view in FIG. 5.

FIGS. 9A through 9E illustrate cross-sectional views of a semiconductor wafer 100 during different stages of processing to yield the semiconductor die of FIG. 5. The same or similar processing steps can be employed to yield the semiconductor die shown in FIGS. 1 and 4, with the main difference being placement of the seal ring 120.

Figure 9A:
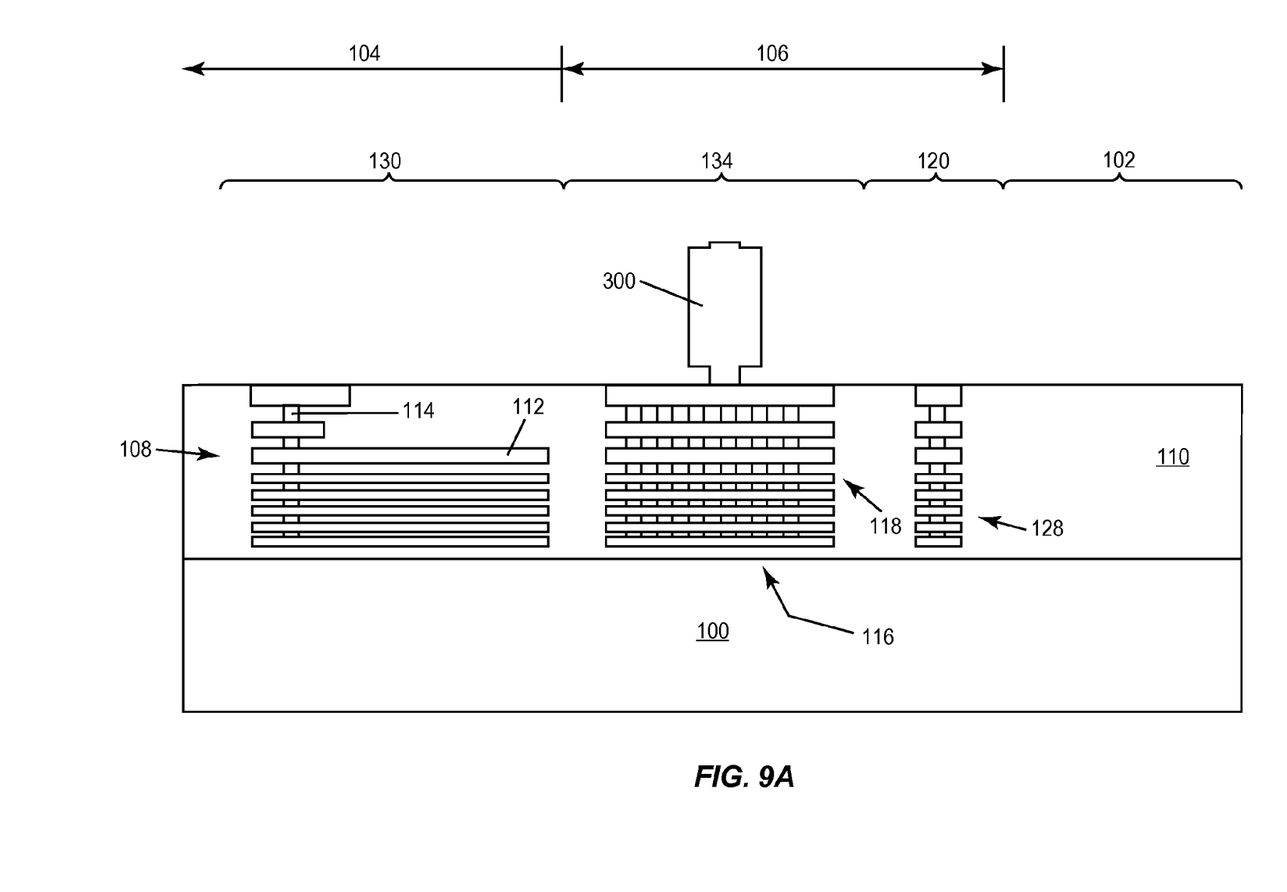
FIGS. 9A through 9E illustrate cross-sectional views of the semiconductor wafer shown in FIG. 5 at different stages of a manufacturing process according to an embodiment.

FIG. 9A shows the semiconductor wafer 100 after the integrated circuit devices are formed in the wafer 100 in the active region 104 of the die, the interlayer dielectric 110 is formed on the wafer 100, and the interconnect wiring 108, ancillary wiring 118 and crack stop structure 128 are formed in the interlayer dielectric 110. The crack stop structure 128 can be formed in the interlayer dielectric 110 between the ancillary wiring 118 and the scribe line 102, as shown in FIG. 9A. Alternatively, the crack stop structure 128 can be formed in the interlayer dielectric 110 between the interconnect wiring 108 and the ancillary wiring 118, e.g. as shown in FIGS. 1 and 4. In each case, various conventional processes well known to those skilled in the art such as material deposition and removal, dopant implantation, annealing, etc. can be employed to form these parts of the dies. For example, the integrated circuit can be constructed from one or more of FETs (field effect transistors), BJTs (bipolar junction transistors), diodes, passive devices, memory cells, etc. formed in the active region 104 of the semiconductor wafer 100. The semiconductor wafer 100 can be a monocrystalline semiconductor such as silicon or SiC, or a compound semiconductor such as GaAs, GaN, etc. The interlayer dielectric 110 can be a dielectric such as silicon dioxide or a lower low-k dielectric material such as fluorine or carbon-doped silicon dioxide, porous silicon dioxide, etc. The wiring 108, 118, 128 formed in the interlayer dielectric 110 can be single or multi-layered and comprise copper, aluminum or a combination of both as previously described herein. No further explanation is provided with regard to such processes. FIG. 9A also shows a test probe 300 in contact with the ancillary wiring 118 during the last PCM test procedure.

Figure 9B:
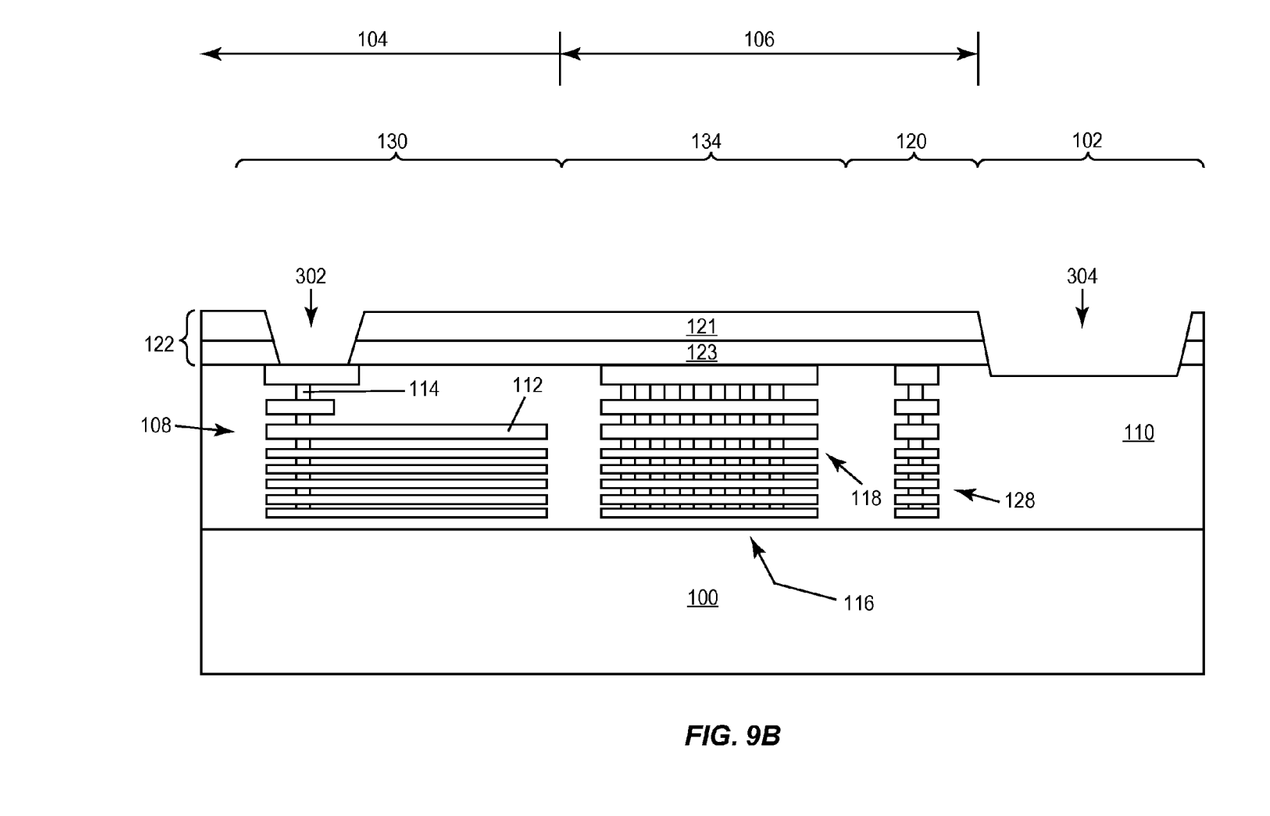

FIG. 9B shows the semiconductor wafer 100 after an interconnect passivation 122 is formed on the interlayer dielectric 110 and openings 302 are formed in the interconnect passivation 122 to expose regions of the uppermost metal layer 112 of the interconnect wiring 108. A metal redistribution layer will be formed on and defined by the exposed regions of the uppermost metal layer 112. The interconnect passivation 122 can be a scratch-resistant material, such as silicon nitride 121 and/or silicon dioxide 123, and prevents deterioration of electronic properties caused by water, ions, and other external contaminants. An opening 304 can also be formed through the interconnect passivation 122 in the scribe line 102, if useful in aiding the subsequent wafer sawing process. Otherwise, the interconnect passivation 122 can remain intact in the scribe line 102. In either case, the interlayer dielectric 110 can be devoid of any metal in the scribe line 102 as shown in FIG. 9B, or can instead contain metal, e.g. as shown in FIG. 4.

Figure 9C:
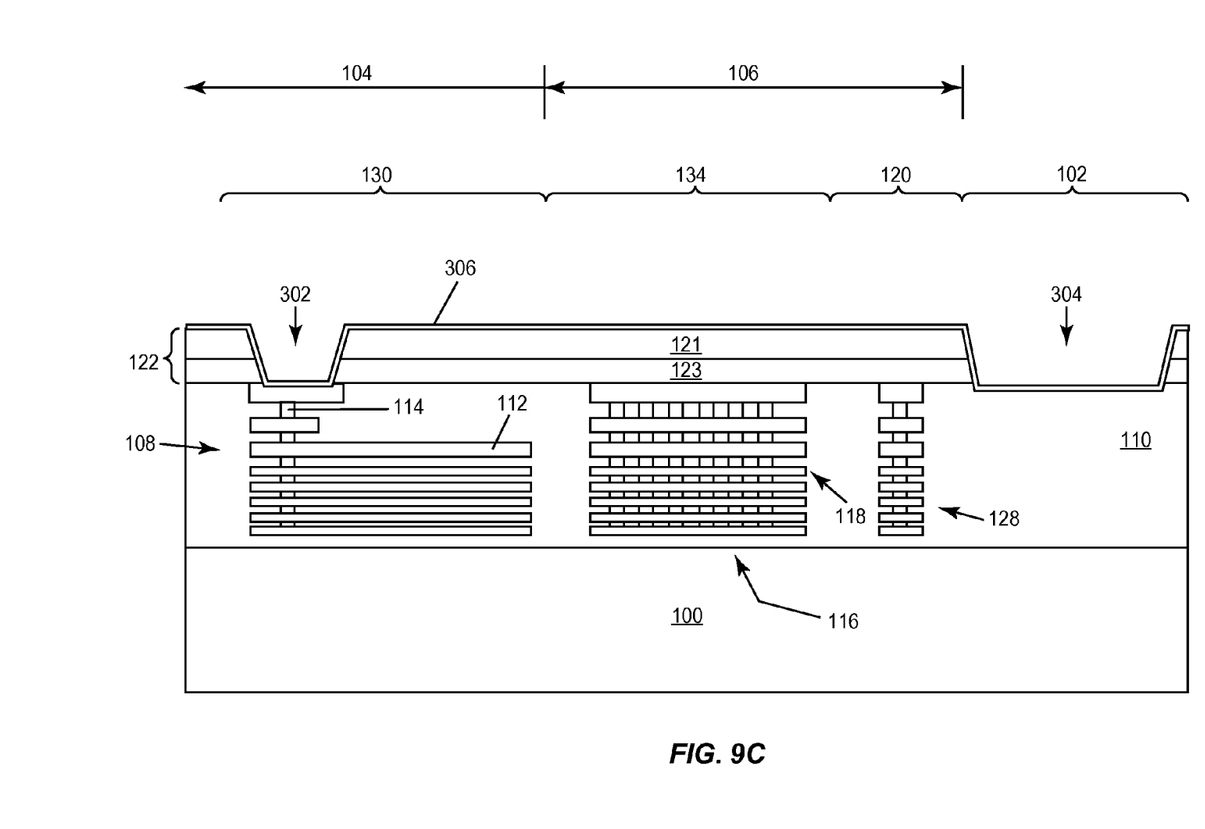

FIG. 9C shows the semiconductor wafer 100 after deposition of a copper seed layer 306 covering the interconnect passivation 122 and the exposed regions of the interconnect wiring 108.

Figure 9D:
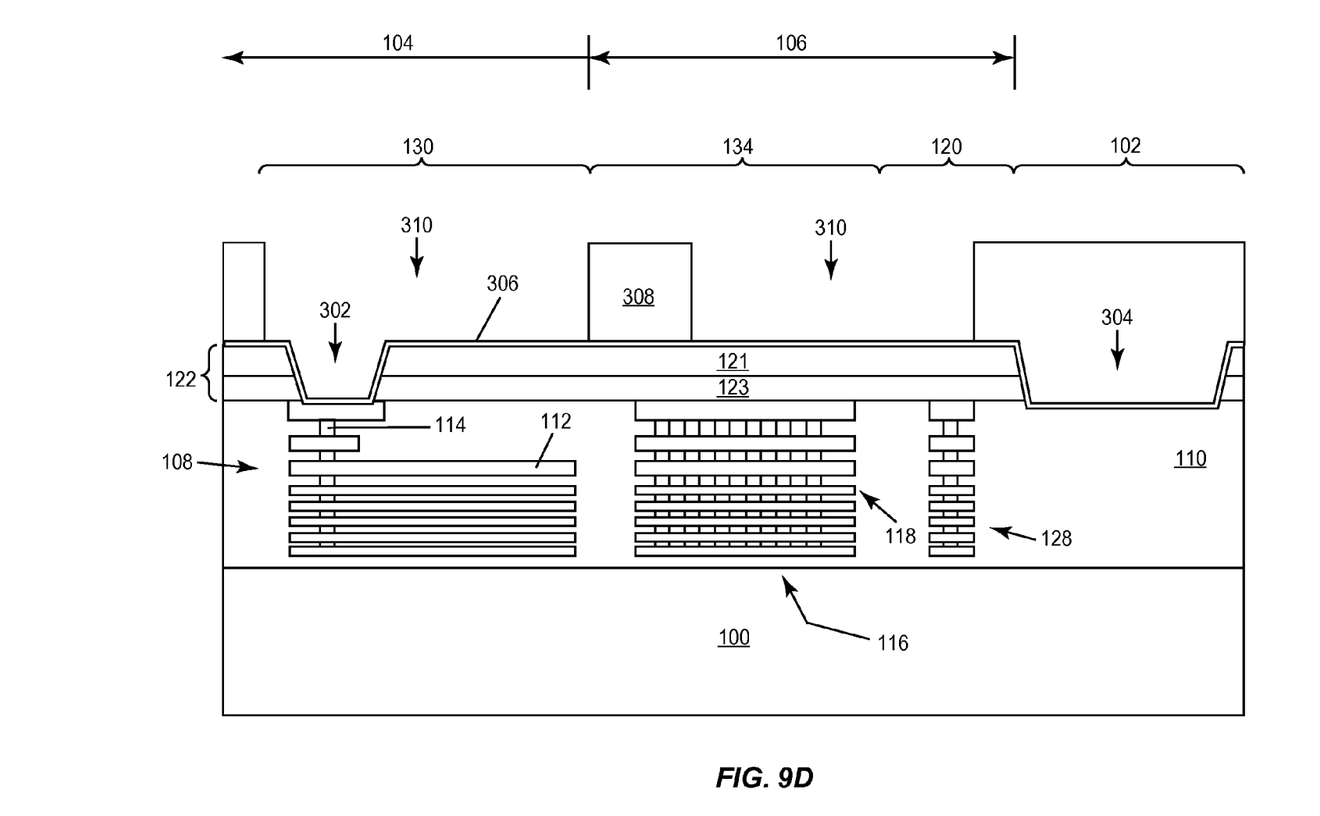

FIG. 9D shows the semiconductor wafer 100 after a mask 308 is formed on the copper seed layer 306. The mask 308 is patterned to have openings 310 which expose parts of the copper seed layer 306 over the active region 104 and edge region 106 of each semiconductor die.

Figure 9E:
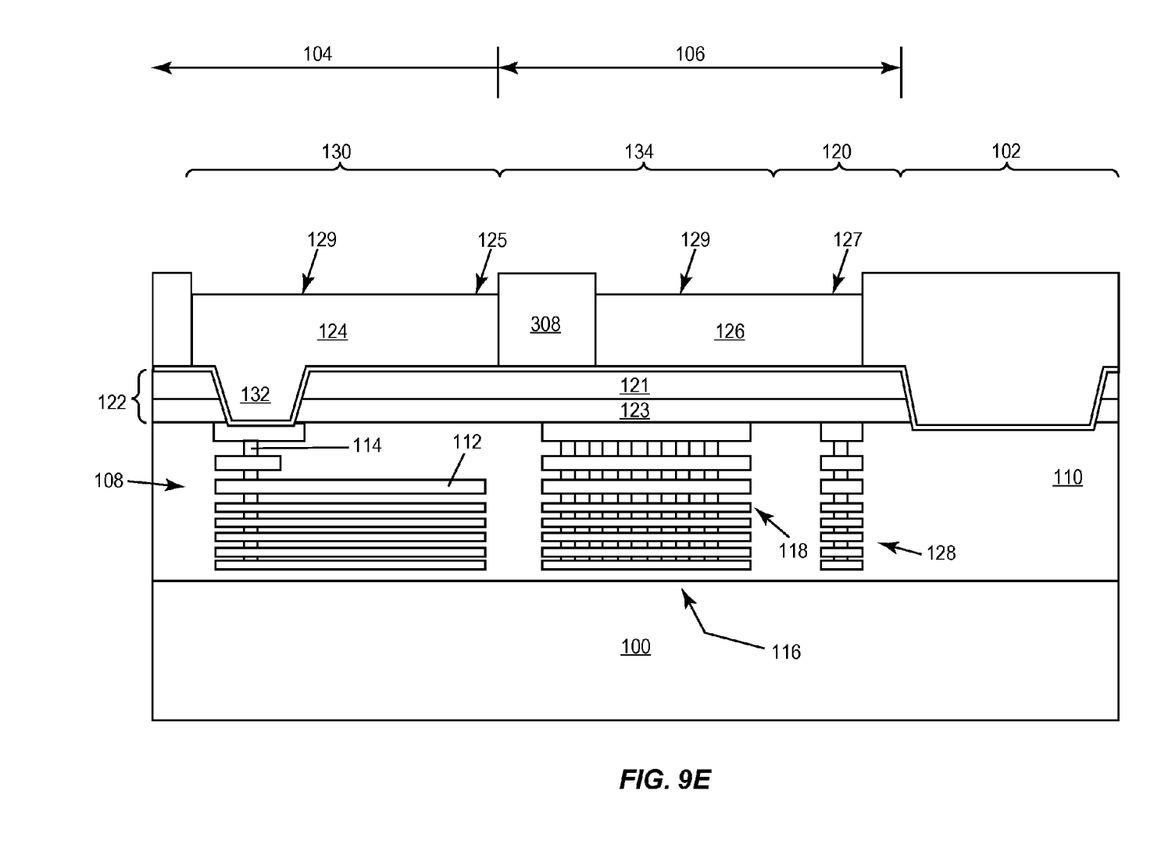

FIG. 9E shows the semiconductor wafer 100 after galvanic plating of copper on the exposed parts of the copper seed layer 306. This step forms bond pads 124 and respective conductive vias 132 over the interconnect wiring 108 of each semiconductor die. This step also forms additional bond pads 126 over the PCM structures 116 and respective conductive vias 136 of each semiconductor die, and forms electrical connections 140 between the additional bond pads 126 and the interconnect wiring 108 of each semiconductor die. The electrical connections (connectors 140 and vias 136) between the additional bond pads 126 and the interconnect wiring 108 is out-of-view in FIG. 9E, but visible, e.g., in FIGS. 2 and 7.

The mask 308 can then be removed and a final passivation 142 formed which covers the interconnect passivation 122, covers edges 125 of the bond pads 124 over the interconnect wiring 108 of each semiconductor die, and covers edges 127 of the additional bond pads 126 over the PCM structures 116 of each semiconductor die. The remaining (top) surface of the bond pads 124, 126 are exposed so that each bond pad 124, 126 has a bonding surface 129 unobstructed by the final passivation 142. The final passivation 142 is not shown in FIG. 9E, but can be seen in FIGS. 1, 4 and 5. The semiconductor dies formed on the semiconductor wafer 100 are then separated from each other by sawing through the interlayer dielectric 110 and the semiconductor wafer 100 along the scribe lines 102. During this process, the semiconductor wafer 100 (with up to thousands or millions of circuits) is cut into rectangular pieces, each called a die. In between those functional parts of the circuits, a thin non-functional spacing is provided where a saw can safely cut the semiconductor wafer 100 without damaging the circuits. This spacing is called scribe line or saw street 102. The width of the scribe line 102 tends to be very small, and, therefore, a very thin and accurate saw may be needed to cut the semiconductor wafer 100 into pieces. For example, the dicing is typically performed with a water-cooled circular saw with diamond or silicon carbide abrasive particles embedded into the blade. Other wafer dicing techniques can also be used.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
a semiconductor substrate having an edge region surrounding an active region, the active region containing devices of an integrated circuit;
interconnect wiring over the active region in an interlayer dielectric and electrically connected to the devices in the active region;
ancillary wiring over the edge region in the interlayer dielectric and isolated from the interconnect wiring and the devices in the active device region;
a passivation on the interlayer dielectric;
a plurality of bond pads over the interconnect wiring and electrically connected to the interconnect wiring through openings in the passivation over the active region; and
a plurality of additional bond pads over the ancillary wiring and electrically connected to the interconnect wiring through additional openings in the passivation over the active region.

2. The semiconductor die according to claim 1, further comprising a crack stop structure in the interlayer dielectric between the interconnect wiring and the ancillary wiring, wherein the crack stop structure is configured to reduce or prevent crack propagation.

3. The semiconductor die according to claim 2, wherein the additional bond pads do not cover any part of the crack stop structure.

4. The semiconductor die according to claim 1, further comprising a crack stop structure in the interlayer dielectric between the ancillary wiring and a lateral edge of the semiconductor die, wherein the crack stop structure is configured to reduce or prevent crack propagation.

5. The semiconductor die according to claim 1, wherein the bond pads over the interconnect wiring, the additional bond pads over the ancillary wiring and at least one or more upper layers of the interconnect wiring comprise copper.

6. The semiconductor die according to claim 1, wherein the semiconductor die has a lateral edge which terminates the edge region of the semiconductor substrate and the interlayer dielectric, and wherein the interlayer dielectric is devoid of any metal between the lateral edge of the semiconductor die and the ancillary wiring.

7. The semiconductor die according to claim 1, wherein each additional bond pad over the ancillary wiring is electrically connected to the interconnect wiring through a metal connector extending from that additional bond pad along the passivation and terminating between adjacent ones of the bond pads over the active region and an electrically conductive via disposed in one of the additional openings in the passivation over the active region.

8. The semiconductor die according to claim 1, further comprising an additional passivation covering the passivation on the interlayer dielectric, edges of the bond pads over the interconnect wiring and edges of the additional bond pads over the ancillary wiring so that the bond pads over the interconnect wiring and the additional bond pads over the ancillary wiring each have a bonding surface unobstructed by the additional passivation.

9. The semiconductor die according to claim 1, further comprising a seal ring which prevents cracks from propagating inward from the edge region to the active region and forms a moisture barrier, wherein the ancillary wiring terminates prior to reaching the seal ring.

10. A method of manufacturing a semiconductor die, the method comprising:
forming a semiconductor substrate having an edge region surrounding an active region, the active region containing devices of an integrated circuit;
forming interconnect wiring over the active region in an interlayer dielectric and in electrical connection with the devices in the active region;
forming ancillary wiring over the edge region in the interlayer dielectric and in isolation from the interconnect wiring and the devices in the active device region;

forming a passivation on the interlayer dielectric;
forming a plurality of bond pads over the interconnect wiring and in electrical connection to the interconnect wiring through openings in the passivation over the active region; and
forming a plurality of additional bond pads over the ancillary wiring and in electrical connection to the interconnect wiring through additional openings in the passivation over the active region.

11. The method according to claim 10, further comprising forming a crack stop structure in the interlayer dielectric between the interconnect wiring and the ancillary wiring, wherein the crack stop structure is configured to reduce or prevent crack propagation.

12. The method according to claim 10, further comprising forming a crack stop structure in the interlayer dielectric between the ancillary wiring and a lateral edge of the semiconductor die, wherein the crack stop structure is configured to reduce or prevent crack propagation.

* * * * *